United States Patent
Kadner

(10) Patent No.: US 7,394,239 B2
(45) Date of Patent: Jul. 1, 2008

(54) METHOD AND CIRCUIT ARRANGEMENT FOR THE SELF-TESTING OF A REFERENCE VOLTAGE IN ELECTRONIC COMPONENTS

(75) Inventor: Martin Kadner, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/562,074

(22) PCT Filed: Jun. 17, 2004

(86) PCT No.: PCT/IB2004/050927

§ 371 (c)(1),
(2), (4) Date: Apr. 12, 2007

(87) PCT Pub. No.: WO2004/013937

PCT Pub. Date: Dec. 29, 2004

(65) Prior Publication Data

US 2007/0216395 A1   Sep. 20, 2007

(30) Foreign Application Priority Data

Jun. 25, 2003 (EP) .................................. 03101870

(51) Int. Cl.
*G01R 25/00* (2006.01)
*G01R 31/02* (2006.01)

(52) U.S. Cl. ...................... 324/76.77; 324/755; 324/763
(58) Field of Classification Search ............. 324/76.77, 324/755, 763
See application file for complete search history.

(56) References Cited

U.S. PATENT DOCUMENTS 3,905,557 A * 9/1975 Grommes et al. ............. 241/30
5,573,099 A * 11/1996 Church et al. ............... 194/317
5,773,967 A * 6/1998 Tenten ......................... 323/313

* cited by examiner

*Primary Examiner*—Timothy J Dole
(74) *Attorney, Agent, or Firm*—Peter Zawilski

(57) ABSTRACT

A method for the self-testing of a reference voltage in electronic components includes a circuit arrangement for a self-test of the reference voltage that can be implemented in the form of an on-chip test, eg., for which no external reference voltage source is required. The reference voltage ($U_{ref}$) is fed to a voltage-controlled oscillator whose output forms the input to a Wien-Robinson bridge whose output signal is checked in a phase detector for its phase shift relative to the input to the Wien-Robinson bridge to check the balance of the Wien-Robinson bridge. The Wien-Robinson bridge is set to be balanced at a frequency ($OMEGA_{ref.test}$) that is generated in the oscillator at the nominal value$_{(Uref.tes)}$ selected for the reference voltage ($U_{ref}$), and a pass signal is generated if the bridge is balanced and a fail signal is generated if it is not.

8 Claims, 1 Drawing Sheet

METHOD AND CIRCUIT ARRANGEMENT FOR THE SELF-TESTING OF A REFERENCE VOLTAGE IN ELECTRONIC COMPONENTS

The invention relates to a method and a circuit arrangement for the self-testing of a reference voltage in electronic components.

During the production process, but also when operating in the field, integrated circuits need to be tested to ensure they are operating correctly. Because there are many disadvantages to using external testing devices, given that contact has to be made with each chip individually and subsequent testing of the chip under operating conditions is not possible, testing circuits built into the chip itself have become an established practice. This method of testing is known by the name BIST (Built-In Self-Test). BIST gives a chip a closed-loop procedure for identifying faults.

The circuits are often fitted with internally regulated voltage sources that are used as sources of reference voltages for comparison with voltages or currents within the integrated circuitry belonging to the circuits. These reference-voltage sources are intended to be as insensitive as possible to the effects of temperature and to external power-supply means from which the voltages fluctuate. To enable a test to be made to check that these conditions are being met, it is known for the reference voltage from a source of this kind to be compared with an external reference voltage. This has the disadvantage that has already been described above for BIST, namely that when the chip is operating in the field contact has to be made with it from outside, which involves an unusual amount of circuitry and cost.

It is an object of the invention to define a circuit arrangement for the self-testing of the reference voltage that can be implemented as an on-chip test, i.e. for which no external reference-voltage source is required.

In accordance with the invention, this object is achieved by virtue of the features of claims 1 and 2.

Under these, the reference voltage is fed to a voltage-controlled oscillator whose output forms the input to a Wien-Robinson bridge whose output signal is checked in a phase detector for its phase shift relative to the input to the Wien-Robinson bridge to check the balance of the Wien-Robinson bridge. The bridge is set to be balanced at a frequency that, in the oscillator, has a zero phase shift at the nominal value selected for the reference voltage. When this state exists, the phase detector produces a pass signal, or if not a fail signal.

An associated circuit arrangement has a voltage-controlled oscillator whose output voltage is fed to a Wien-Robinson bridge whose output forms the input to a phase detector.

These and other aspects of the invention are apparent from and will be elucidated with reference to the embodiment described hereinafter.

Figure 1:
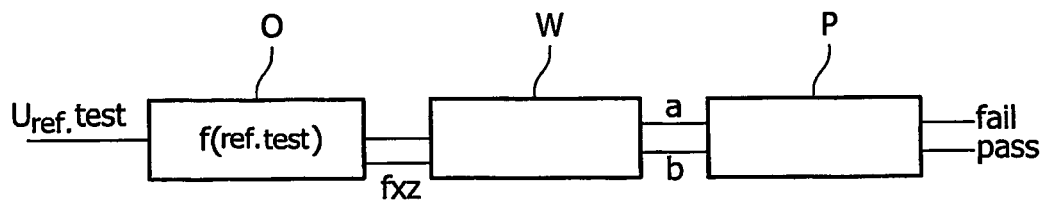
FIG. 1 is a block circuit diagram showing the principle of the self-testing.
Figure 2:
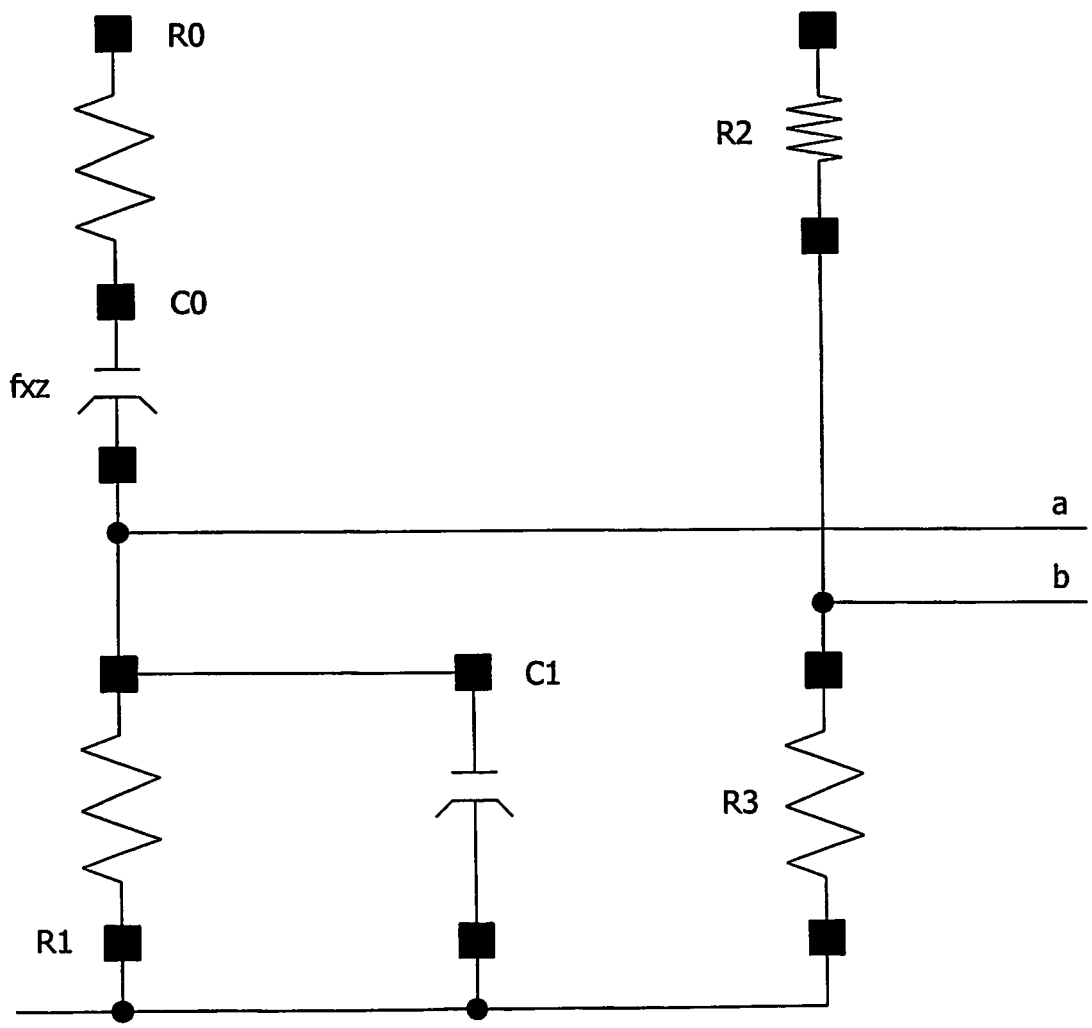
FIG. 2 shows the construction of the Wien-Robinson bridge.

The on-chip reference test according to the invention is based on a Wien-Robinson bridge W that measures a frequency. To enable a voltage of a given frequency to be generated from a reference voltage $U_{ref}$ to be tested, use is made of a voltage-controlled oscillator O that generates the frequency to be tested $f_{x\sim}$ from the reference voltage $U_{ref}$. The dependence of the frequency $f_{x\sim}$ from the oscillator on the input voltage must be unambiguous. The outputs a and b of the Wien-Robinson bridge are then compared with one another by means of the phase detector P.

The conditions governing the balanced state of the Wien-Robinson bridge are:

$$R3\left(R0 - j\frac{1}{wC0}\right) = R2\left(\frac{1}{\frac{1}{R1}jwC1}\right)$$

When the bridge is balanced, the phase of the output voltage from the bridge has a zero crossing. The values of the resistors R0, R1, R2, R3 in the Wien-Robinson bridge and of the capacitors C0, C1 in it are therefore selected to be such that the phase shift is zero at the nominal value $U_{ref.test}$ selected for the reference voltage $U_{ref}$. The phase detector then checks the phase shift between the two outputs a and b of the Wien-Robinson bridge. On the basis of the result, a statement can be made about the correctness of the reference voltage $U_{ref}$ that has been tested.

Apart from depending on the reference voltage $U_{ref}$ to be tested, the result depends only on the values of the components in the oscillator and the Wien-Robinson bridge, which values can be set by a once-only calibration. The test is thus independent of external reference voltages.

LIST OF REFERENCE CHARACTERS:

| | |
|---|---|
| $U_{ref}$ | Reference voltage |
| W | Wien-Robinson bridge |
| a | Output of Wien-Robinson bridge |
| b | Output of Wien-Robinson bridge |
| O | Oscillator |
| P | Phase detector |
| fail | Signal |
| pass | Signal |
| Rn | Resistors |
| Cn | Capacitors |
| $f_{x\sim}$ | Frequency |

The invention claimed is:

1. A method for the self-testing of a reference voltage in electronic components, characterized in that the reference voltage is fed to a voltage-controlled oscillator (VCO) whose output forms the input to a Wien-Robinson bridge whose output signal is checked in a phase detector for its phase shift relative to the input to the Wien-Robinson bridge to check the balance of the Wien-Robinson bridge, the Wien-Robinson bridge being set to be balanced at a frequency that is generated in the (VCO) at the nominal value selected for the reference voltage, and a pass signal is generated if the Wien-Robinson bridge is balanced and a fail signal is generated if it is not.

2. The method of claim 1, wherein the Wien-Robinson Bridge includes resistors and capacitors with values selected for a zero phase shift at a nominal value selected for the reference voltage.

3. The method of claim 1, wherein the Wien-Robinson Bridge includes resistors and capacitors with values selected for a zero phase shift at a nominal value selected for the reference voltage, the phase of a voltage at the output of the bridge having a zero crossing when the bridge is balanced.

4. The method of claim 1, wherein the Wien-Robinson Bridge includes resistors and capacitors with values selected for a zero phase shift at a nominal value selected for the reference voltage, and further including calibrating the values.

5. A circuit arrangement for the self-testing of a reference voltage in electronic components, characterized in that it has a voltage-controlled oscillator (VCO) whose output voltage is fed to a Wien-Robinson bridge whose output forms the input to a phase detector, the Wien-Robinson bridge being set to be balanced at a frequency that is generated in the (VCO) at the nominal value selected for the reference voltage and the output of the phase detector generates a fail signal if a threshold value is exceeded, and a pass signal if it is not.

6. The circuit arrangement of claim 5, wherein the Wien-Robinson Bridge includes resistors and capacitors with values selected for a zero phase shift at a nominal value selected for the reference voltage.

7. The circuit arrangement of claim 5, wherein the Wien-Robinson Bridge includes resistors and capacitors with values selected for a zero phase shift at a nominal value selected for the reference voltage, the phase of a voltage at the output of the bridge having a zero crossing when the bridge is balanced.

8. The circuit arrangement of claim 5, wherein the Wien-Robinson Bridge includes resistors and capacitors with values selected for a zero phase shift at a nominal value selected for the reference voltage, and further including calibrating the values.

* * * * *